(12) United States Patent
Wu et al.

(10) Patent No.: US 7,858,147 B2
(45) Date of Patent: Dec. 28, 2010

(54) INTERCONNECT STRUCTURE AND METHOD OF FABRICATING THE SAME

(75) Inventors: Yu-Tsung Wu, Taipei (TW); Jen-Hong Huang, Kaohsiung (TW); Chung-Min Tsai, Taipei (TW); Huan-Chieh Su, Changhua County (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 148 days.

(21) Appl. No.: 12/229,233

(22) Filed: Aug. 20, 2008

(65) Prior Publication Data

US 2009/0197113 A1    Aug. 6, 2009

(30) Foreign Application Priority Data

Jan. 31, 2008    (TW) .............................. 97103638 A

(51) Int. Cl.
*B05D 5/12* (2006.01)
*C23C 16/00* (2006.01)
*B05D 3/00* (2006.01)
*C23C 14/00* (2006.01)

(52) U.S. Cl. .................... 427/98.4; 427/97.1; 427/98.5; 427/249.1; 427/554; 427/555; 204/192.15

(58) Field of Classification Search ................ 427/98.4, 427/249.1, 554, 555, 97.1, 98.5; 204/192.15
See application file for complete search history.

(56) References Cited

U.S. PATENT DOCUMENTS

| 7,094,679 | B1 | 8/2006 | Li et al. |
| 7,312,531 | B2 | 12/2007 | Chang et al. |
| 2008/0159945 | A1* | 7/2008 | Chen et al. ............... 423/447.3 |

FOREIGN PATENT DOCUMENTS

JP    2005-231952    *    9/2005

* cited by examiner

*Primary Examiner*—Brian K Talbot
(74) *Attorney, Agent, or Firm*—J.C. Patents

(57) ABSTRACT

A method of fabricating an interconnect structure is described. A substrate is provided. A patterned interfacial metallic layer is formed on the substrate. An amorphous carbon insulating layer or a carbon-based insulating layer is formed covering the substrate and the interfacial metallic layer. A conductive carbon line or plug is formed in the amorphous carbon or carbon-based insulating layer electrically connected with the interfacial metallic layer. An interconnect structure is also described, including a substrate, a patterned interfacial metallic layer on the substrate, an amorphous carbon insulating layer or a carbon-based insulating layer on the substrate, and a conductive carbon line or plug disposed in the amorphous carbon or carbon-based insulating layer and electrically connected with the interfacial metallic layer.

11 Claims, 3 Drawing Sheets

INTERCONNECT STRUCTURE AND METHOD OF FABRICATING THE SAME

CROSS-REFERENCE TO RELATED APPLICATION

This application claims the priority benefit of Taiwan application serial no. 97103638, filed Jan. 31, 2008. The entirety of the above-mentioned patent application is hereby incorporated by reference herein and made a part of this specification.

BACKGROUND OF THE INVENTION

1. Field of Invention

This invention relates to integrated circuit structures and fabrication thereof, and more particularly to an interconnect structure and a method of fabricating the same.

2. Description of Related Art

High-integration semiconductor IC chips generally have at least two layers of metal interconnect, which are called "multilevel interconnects" and are intended to fit the ever increased density of devices.

FIG. 1A depicts a cross section of an interconnect structure in the prior art. The structure 10a includes a substrate 100 with a copper line 102 therein, a metal barrier 104, a SiN barrier 106, a Si-based insulating layer 108 on the substrate 100 and a copper plug 110 in the layer 108. The SiN barrier 106 is disposed between the insulating layer 108 and substrate 100. The SiN barrier 106 and the layer 108 have therein an opening 109 exposing the copper line 102. The copper plug 110 is disposed in the opening 109 and electrically connected to the copper line 102. The metal barrier 104 is between the plug 110 and the sidewall of the opening 109 and between the plug 110 and the line 102.

With the development in the IC technology, the size of IC device is unceasingly reduced so that the width of the opening 109 is reduced accordingly. Thus, the current density in the copper plug 110 is raised so that the devices are easily damaged lowering the device reliability. Moreover, the metal barrier 104 usually includes tantalum (Ta), TaN or Ta/TaN having higher resistance than copper so that when the device size is reduced, the resistance ratio of the metal barrier 104 to the copper plug 110 is raised more causing an even higher resistance of the conductive structure 110+104.

Interconnect structures with carbon nanotubes instead of a copper plug have also been studied, in consideration that the sustainable current density of nanotubes is about 1000 times that of copper. FIG. 1B depicts such an interconnect structure 10b, which includes a substrate 100, a copper line 102 in the substrate 100, a metal barrier 104, an Si-based insulating layer 108 on the substrate 100, a Ta barrier 106, a cobalt or nickel layer 116 and a conductive plug 118 including carbon nanotubes. The metal barrier 104 is between the substrate 100 and copper line 102. The Ta barrier 106 is disposed between the insulating layer 108 and the substrate 100. The insulating layer 108 has therein an opening 109 exposing the Ta barrier 106. The cobalt or nickel layer 116 is disposed in the opening 109 on the Ta barrier 106. The conductive plug 118 including carbon nanotubes is disposed in the opening 109 on the cobalt or nickel layer 116.

However, when the Ta barrier 106 as a conductor is deposited on the whole die, as shown in FIG. 1B, the underlying copper line 102 is shorted with conductor structures in other areas via the Ta barrier 106. Since the Ta barrier 106 is difficult to pattern due to the high device density, such an interconnect structure 10b is difficult to apply.

For the interconnect structure 10b, researchers in Fujitsu Company and Infineon Technologies have made quite a few studies. In their methods, the catalytic layer 116 is formed on a conductive region of the substrate 100 by lithography and etching. A Si-based insulating layer 108 is formed, including $SiO_2$ or $SiO_2$ doped with other low-k material. An opening 109 is formed in the insulating layer 108 with lithography and etching. A CVD step is conducted with a carbon source gas so that carbon nanotubes as a plug 118 is formed in the opening 109 with the catalysis of the catalytic layer 116.

However, for the opening 109 is formed by lithography-etching, much process time is consumed. Moreover, since the carbon nanotubes have to be grown at a higher temperature in vacuum, the cost is higher. In summary, the fabricating process of the interconnect structure 10b is relatively complicated and the cost is relatively high.

SUMMARY OF THE INVENTION

This invention provides a method of fabricating an interconnect structure, which is self-aligned and is workable at a lower substrate temperature under the atmospheric pressure, thus simplifying the process and lowering the fabrication cost.

This invention also provides an interconnect structure formed with the method of fabricating an interconnect structure of this invention.

A method of fabricating an interconnect structure of this invention is described. A substrate is provided. A patterned interfacial metallic layer is formed on the substrate. An amorphous carbon insulating layer or a carbon-based insulating layer is formed covering the substrate and patterned interfacial metallic layer. A conductive carbon line or plug is formed in the amorphous carbon or carbon-based insulating layer electrically connected with the patterned interfacial metallic layer.

An interconnect structure of this invention includes a substrate, a patterned interfacial metallic layer on the substrate, an amorphous carbon insulating layer or a carbon-based insulating layer on the substrate, and a conductive carbon line or plug that is disposed in the amorphous carbon or carbon-based insulating layer and electrically connected with the patterned interfacial metallic layer.

In an embodiment, the conductive carbon line or plug is formed from amorphous carbon or the material of the carbon-based insulating layer through the catalysis of the interfacial metallic layer. Such conductive carbon line or plug may include conductive carbon nanotubes or conductive carbon nanofibers, and formation thereof may include irradiating the amorphous carbon or carbon-based insulating layer on the interfacial metallic layer with a laser direct writing method, which may utilize pulsed laser.

The embodiment using laser direct writing to form conductive carbon nanotubes or fibers acting as a conductive line or plug is advantageous in fabricating interconnects of nanometer devices. Such a process is self-aligned and workable at a low substrate temperature for growing carbon nanotubes of fibers, so that out-diffusion of previously implanted dopants due to high temperature and peeling-off of metal layers are prevented. The low substrate temperature also increases the flexibility in selecting the catalyst and the materials of the prior processes and in designing the IC layouts. It is also noted that due to the low substrate temperature, the amorphous carbon not irradiated by the laser does not recrystallize. Accordingly, growing carbon nanotubes or nanofibers by laser direct writing is promising in future fabricating processes of nanometer devices.

In order to make the aforementioned and other objects, features and advantages of the present invention comprehensible, a preferred embodiment accompanied with figures is described in detail below.

DESCRIPTION OF EMBODIMENTS

Figure 2A:
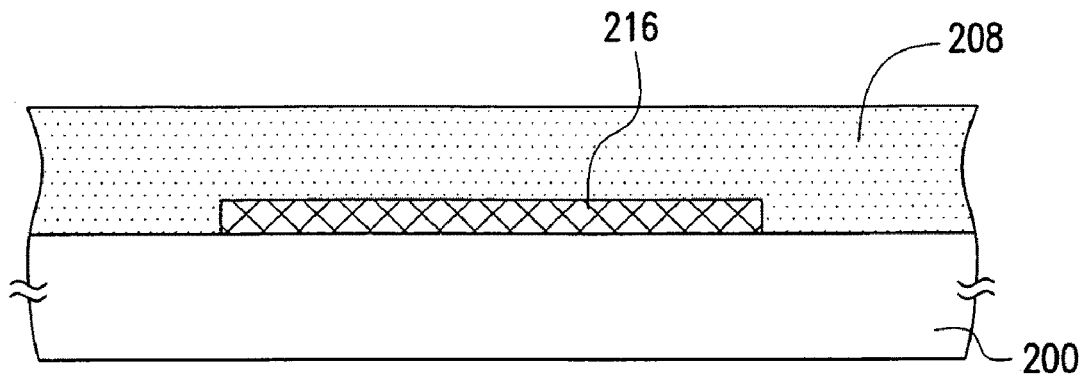
FIGS. 2A and 2B depict, in a cross-sectional view, a method of fabricating an interconnect structure according to an embodiment of this invention.
Figure 2B:
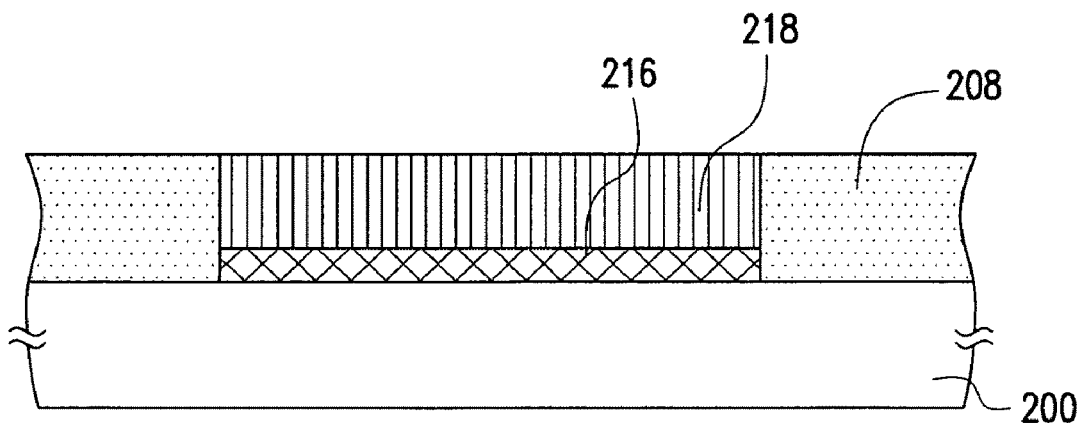

FIGS. 2A and 2B depict, in a cross-sectional view, a method of fabricating an interconnect structure according to an embodiment of this invention. FIG. 2B also shows an interconnect structure according to the embodiment of this invention.

Referring to FIG. 2A, a substrate 200 is provided, which may include a conductor or an insulator. According to the property of substrate 200, a conductive carbon plug (or line) is formed through the process described later as the substrate 200 includes a conductor (or insulator). The conductor may include a material selected from the group consisting of metals, metal alloys and conductive polymers. The insulator may include a material selected from a group consisting of silicon oxide, glass and insulating polymers. Then, a patterned interfacial metal layer 216 is formed on the substrate 200, possibly by a deposition step utilizing sputtering, evaporation, CVD, chemical solution self-assembling or ion or electron beam deposition, etc., and a patterning step utilizing lithography and etching, a lift-off process, or nano-imprinting etc. The patterning step is important as determining the position of the carbon-based line or plug formed later.

The interfacial metal layer 216 may include an adhesive layer for tightly bonding the substrate 200, and a catalyst layer needed for growing conductive carbon nanotubes or nanofibers. The adhesive layer may include titanium (Ti). The catalyst layer may include iron, cobalt or nickel, or a compound or alloy thereof, etc. The catalyst layer in the interfacial metal layer 216 usually has a thickness of 100 nm or less, preferably 1-10 nm, to make a catalytic effect, so as to facilitate growth of the carbon nanotubes or nanofibers in the later laser direct writing process and form a conductive carbon line or plug meeting the requirements of future processes with smaller linewidths.

Thereafter, an amorphous carbon insulating layer or a carbon-based insulating layer 208 is formed covering the substrate 200 and the interfacial metallic layer 216, through sputtering, evaporation or CVD, etc. The CVD may be enhanced by plasma powered from RF wave, microwave, electric induction or electron cyclotron resonance (ECR). The insulating layer 208 may have a thickness of 1 μm or less. The thickness relates to the formation and quality of the conductive carbon line or plug formed later.

Referring to FIG. 2B, laser direct writing is performed to the amorphous carbon (or carbon-based) insulating layer 208, so that a portion of the same on the interfacial metallic layer 216 is converted to carbon nanotubes or fibers due to the energy from the laser and the catalytic effect of the catalyst in the interfacial metallic layer 216. Thus, a self-aligned conductive carbon line or plug 218 is formed. The laser direct writing method may utilize pulsed laser, which preferably has a wavelength of 150-800 nm, a pulse width of 1-100 ns, a frequency not more than 100 Hz and an energy density of 0.01-10 $J/cm^2$. The laser direct writing method may be conducted for 4 or less minutes at the atmospheric pressure and room temperature.

Figure 3A:
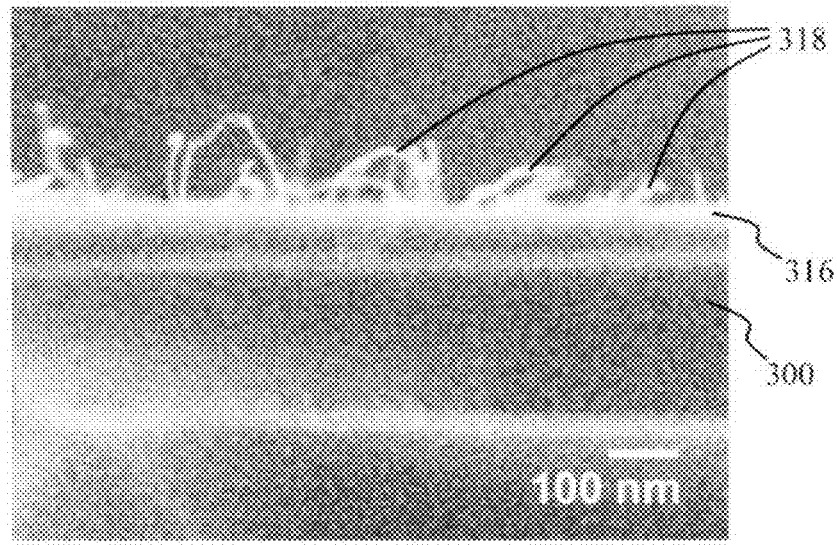
FIGS. 3A and 3B respectively show an SEM image of some carbon nanotubes and a TEM image of a carbon nanotube obtained in an example of this invention.
Figure 3B:
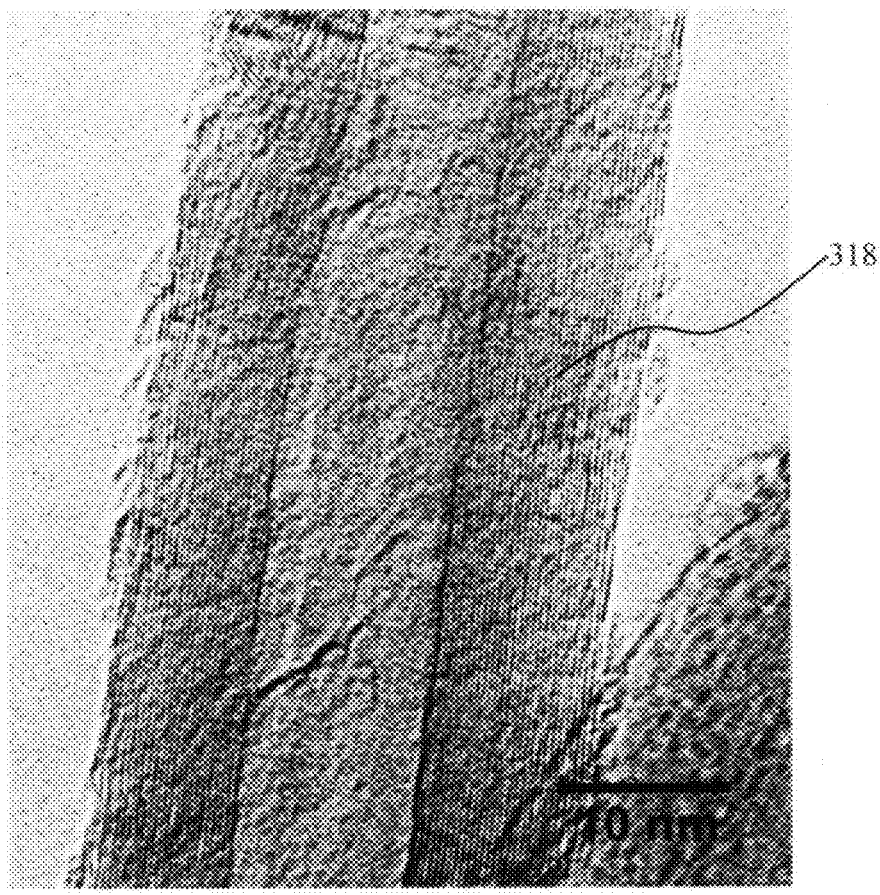

FIGS. 3A and 3B respectively show an SEM image of some carbon nanotubes and a TEM image of a carbon nanotube obtained in an example of this invention. In the example, a substrate layer 300 as a $SiO_2$ layer is deposited with an interfacial layer 316 including an adhesive Ti layer of 7 nm and catalytic Ni layer of 10 nm. An amorphous carbon layer is deposited with PECVD, and then laser direct writing is done with pulsed laser having a pulse width of 20 ns, a frequency of 1 Hz and an energy density of 26 $mJ/cm^2$ at 1 atm and room temperature for 10 seconds, so as to form carbon nanotubes.

Figure 1A:
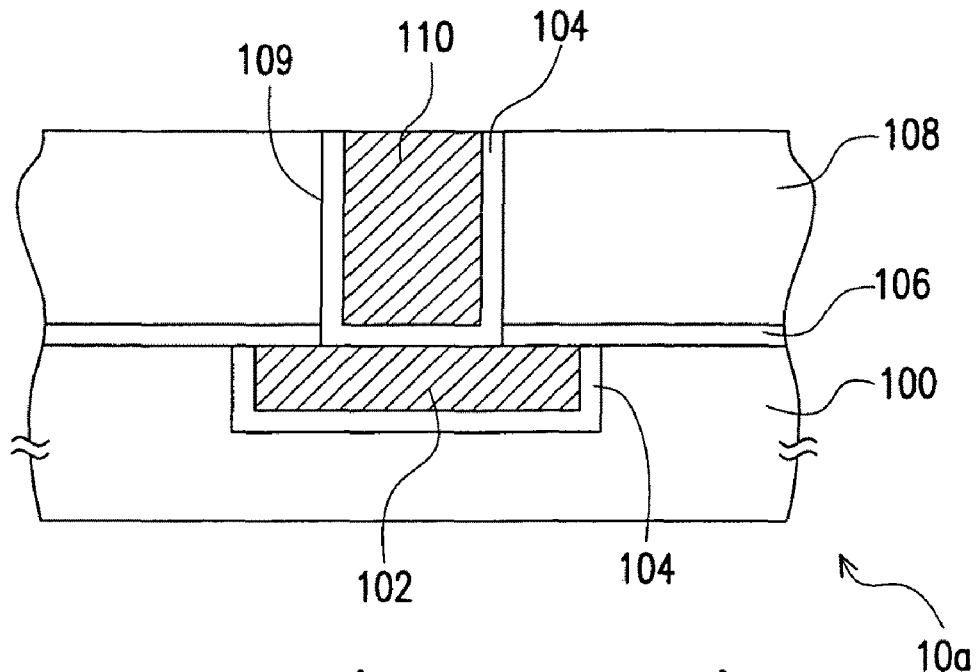
FIG. 1A depicts a cross section of an interconnect structure in the prior art.
Figure 1B:
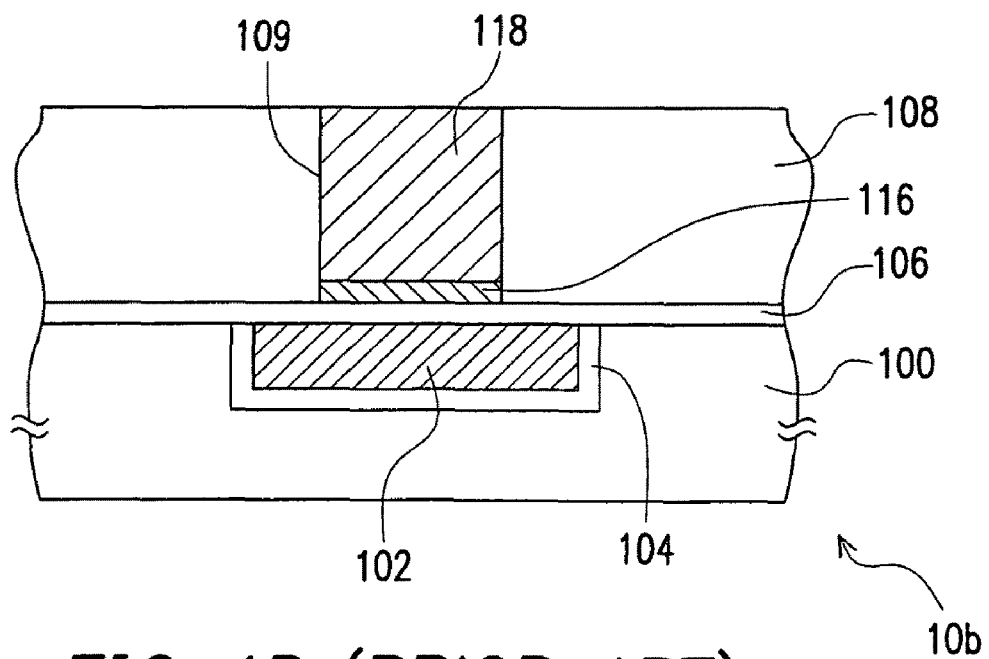
FIG. 1B depicts a cross section of another interconnect structure in the prior art that includes a conductive plug including carbon nanotubes.

According to the property of the substrate 200, a conductive carbon line or plug 218 can be formed through the above process of this embodiment. Specifically, when the substrate 200 includes a conductor being a conductive line as seen in conventional interconnect structures, such as the Cu line 102 in FIGS. 1A/1B, the conductive carbon material formed with the above process is a conductive carbon plug 218 corresponding to a conductive plug as seen in conventional interconnect structures, such as the Cu plug 110. As the substrate 200 includes an insulator, the conductive carbon material formed by the above process is a conductive carbon line 218. By stacking conductive carbon lines and plugs each being formed in an amorphous carbon or carbon-based insulating layer as above, an interconnect structure entirely composed of carbon is possible.

In summary, this embodiment provides a novel method of forming a conductive carbon line or plug, which positions the line or plug by patterning an interfacial metal layer containing a catalyst and utilizes laser direct writing to convert a portion of an amorphous carbon or carbon-based insulating layer to a conductive carbon line or plug in a self-aligned manner. Thus, a new interconnect structure where the dielectric layer and the conductive line or plug both are based on carbon is obtained. The conductive carbon line or plug may includes conductive carbon nanotubes or nanofibers that sustain high current density ($>10^8$ $A/cm^2$). It is expected that carbon nanotubes or nanofibers are formed in a density up to $10^{12}/cm^2$ to be applicable to future smaller devices.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating an interconnect structure, comprising:
   providing a substrate;
   forming a patterned interfacial metallic layer on the substrate;
   forming an amorphous carbon insulating layer or a carbon-based insulating layer covering the substrate and the patterned interfacial metallic layer; and
   irradiating the amorphous carbon insulating layer or the carbon-based insulating layer on the patterned interfacial metallic layer with a laser direct writing method to form, in the amorphous carbon insulating layer or the carbon-based insulating layer, a conductive carbon line or plug that is electrically connected with the patterned interfacial metallic layer.

2. The method of claim 1, wherein the conductive carbon line or plug is formed from amorphous carbon or a material of the carbon-based insulating layer through catalysis of the patterned interfacial metallic layer.

3. The method of claim 2, wherein the conductive carbon line or plug comprises conductive carbon nanotubes or conductive carbon nanofibers.

4. The method of claim 1, wherein the laser direct writing method utilizes pulsed laser.

5. The method of claim 4, wherein the pulsed laser has a wavelength of 150-800 nm, a pulse width of 1-100 ns, a frequency not more than 100 Hz and an energy density of 0.01-10 J/cm$^2$.

6. The method of claim 1, wherein the laser direct writing method is conducted for 4 or less minutes at atmospheric pressure and room temperature.

7. The method of claim 3, wherein the patterned interfacial metallic layer contains iron, cobalt or nickel, or a compound or alloy thereof, as a catalyst for growing the conductive carbon nanotubes or the conductive carbon nanofibers.

8. The method of claim 2, wherein a catalyst layer in the patterned interfacial metallic layer has a thickness of 100 nm or less.

9. The method of claim 1, wherein forming the patterned interfacial metallic layer comprises a deposition step that utilizes sputtering, evaporation, CVD, chemical solution self-assembling or ion or electron beam deposition, and a patterning step that utilizes lithography and etching, a lift-off process or nano-imprinting.

10. The method of claim 1, wherein the amorphous carbon insulating layer or the carbon-based insulating layer is formed through sputtering, evaporation, or CVD that is enhanced by plasma powered by radio-frequency wave, microwave, electric induction or electron cyclotron resonance (ECR).

11. The method of claim 1, wherein the amorphous carbon insulating layer or the carbon-based insulating layer has a thickness of 1 μm or less.

* * * * *